(12) United States Patent
Minich

(10) Patent No.: US 7,052,288 B1  
(45) Date of Patent: May 30, 2006

(54) TWO PIECE MID-PLANE

(75) Inventor: Steven E. Minich, York, PA (US)

(73) Assignee: FCI Americas Technology, Inc., Reno, NV (US)

( * ) Notice: Subject to any disclaimer, the term of this patent is extended or adjusted under 35 U.S.C. 154(b) by 0 days.

(21) Appl. No.: 10/988,029

(22) Filed: Nov. 12, 2004

(51) Int. Cl.
    *H01R 12/00* (2006.01)

(52) U.S. Cl. .................. 439/78; 361/790; 174/266

(58) Field of Classification Search ............ 439/65–66, 439/74–78, 109; 361/790; 174/266
    See application file for complete search history.

(56) References Cited

U.S. PATENT DOCUMENTS

| | | | |
|---|---|---|---|
| 3,022,480 A | 2/1962 | Tiffany | 339/18 |
| 3,284,322 A * | 11/1966 | Pearlstein | 205/126 |
| 3,660,726 A | 5/1972 | Ammon et al. | 317/101 |
| 4,054,939 A * | 10/1977 | Ammon | 361/792 |
| 4,095,866 A * | 6/1978 | Merrill | 439/60 |
| 4,230,385 A * | 10/1980 | Ammon et al. | 439/78 |
| 4,327,247 A * | 4/1982 | Mituhashi et al. | 174/264 |
| 4,431,977 A * | 2/1984 | Sokola et al. | 333/206 |
| 4,524,240 A * | 6/1985 | Stock et al. | 174/254 |
| 4,552,422 A * | 11/1985 | Bennett et al. | 439/69 |
| 4,817,280 A * | 4/1989 | Ozaki | 29/846 |
| 4,868,980 A * | 9/1989 | Miller, Jr. | 29/850 |
| 4,961,806 A * | 10/1990 | Gerrie et al. | 156/252 |
| 5,093,761 A * | 3/1992 | Ozaki | 361/792 |
| 5,184,400 A * | 2/1993 | Cray et al. | 29/879 |
| 5,199,879 A * | 4/1993 | Kohn et al. | 439/63 |
| 5,213,521 A * | 5/1993 | Arisaka | 439/608 |
| 5,243,144 A * | 9/1993 | Ogino et al. | 174/266 |
| 5,293,502 A * | 3/1994 | Kimura et al. | 174/250 |
| 5,327,326 A * | 7/1994 | Komoto et al. | 361/760 |
| 5,352,123 A | 10/1994 | Sample et al. | 439/61 |
| 5,469,330 A * | 11/1995 | Karabatsos et al. | 361/704 |
| 5,565,654 A * | 10/1996 | Zell et al. | 174/265 |
| 5,645,433 A * | 7/1997 | Johnson | 439/66 |
| 5,659,953 A * | 8/1997 | Crane et al. | 29/843 |
| 5,773,195 A * | 6/1998 | Kamperman et al. | 430/312 |
| 5,887,158 A | 3/1999 | Sample et al. | 716/15 |
| 6,196,876 B1 * | 3/2001 | Paagman | 439/607 |
| 6,388,208 B1 * | 5/2002 | Kiani et al. | 174/266 |
| 6,528,737 B1 | 3/2003 | Kwong et al. | 174/262 |
| 6,538,899 B1 | 3/2003 | Krishnamurthi et al. | 361/788 |
| 6,541,712 B1 * | 4/2003 | Gately et al. | 174/266 |
| 6,593,535 B1 | 7/2003 | Gailus | 174/262 |
| 6,608,762 B1 * | 8/2003 | Patriche | 361/788 |
| 2004/0108137 A1 * | 6/2004 | Vetter et al. | 174/262 |

* cited by examiner

*Primary Examiner*—Ross Gushi  
*Assistant Examiner*—Larisa Tsukerman  
(74) *Attorney, Agent, or Firm*—Woodcock Washburn LLP

(57) ABSTRACT

A mid-plane is disclosed. The mid-plane includes a first printed circuit board having a plurality of plated vias adapted to receive tails attached to a first connector and having a plurality of unplated clearance holes adapted to receive tails attached to a second connector. The second printed circuit board has a plurality of plated vias adapted to receive tails attached to the second connector and has a plurality of unplated clearance adapted to receive tails attached to the first connector.

19 Claims, 2 Drawing Sheets

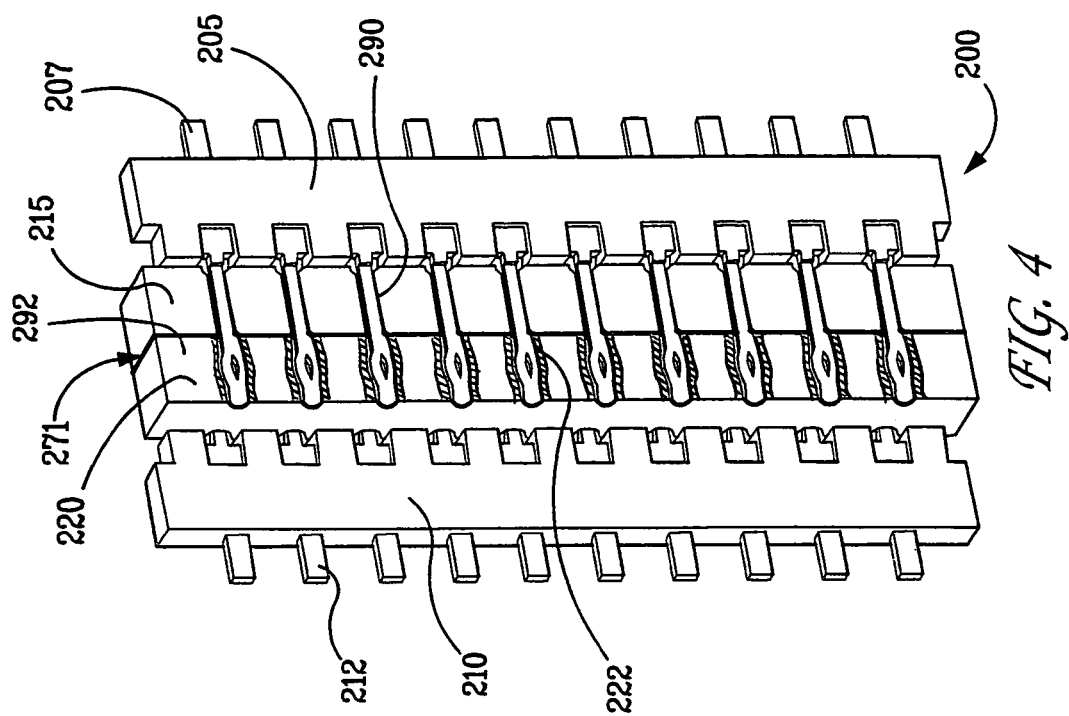
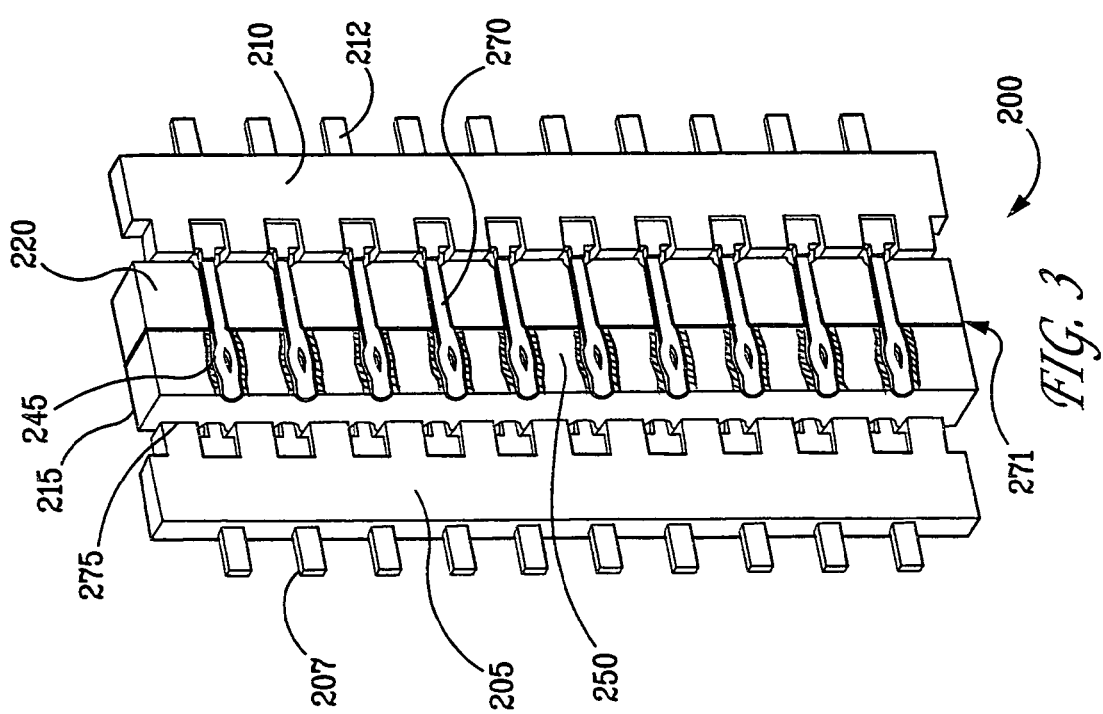

TWO PIECE MID-PLANE

FIELD OF THE INVENTION

The present invention relates to a mid-plane printed circuit board. Specifically, the present invention relates to a mid-plane circuit board having a two piece construction.

BACKGROUND OF THE INVENTION

Printed circuit boards are thin plates in which chips and other electronic devices are placed. The chips and other electronic devices are then electrically connected to each other using conductive traces on the circuit board. Typically, mid-plane printed circuit boards have electrical devices attached to both faces or surfaces of the board and have between one and sixteen conductive layers laminated or glued together. As mid-plane boards become more and more complicated, additional conductive layers are needed. In turn, the additional conductive layers require the mid-plane to become thicker and thicker.

Consequently, the vias in the mid-plane that connect the electrical modules on the surface of the mid-plane to the traces on the various layers in the mid-plane become deeper. The thickness of printed circuit boards may become an issue when a via must be plated to meet a particular aspect ratio (the ratio of the thickness of the printed circuit board to the diameter of the via). Typical guidelines from printed circuit board manufacturers are that the aspect ratio should be below 8–12. For example, the maximum mid-plane thickness for a press fit via that employs a 0.6 mm drill and having an aspect ratio of 10 would be 6 mm.

As a result of thicker mid-planes, "deep" vias become increasingly more difficult to plate effectively and any electrical communication that occurs through the via may become compromised. Additionally, the "deep" vias may require that the mid-plane be back drilled. One purpose of backdrilling is to reduce the length of the via which improves high speed signal characteristics. Long vias act as capacitive stubs which degrade signals as transmission speeds increase. As a result, the manufacturing time and costs associated with thicker mid-planes may increase.

Consequently, there is a need for a low cost mid-plane that can be efficiently and effectively manufactured.

SUMMARY OF THE INVENTION

The present invention overcomes the aforementioned issues by providing, among other things, a two piece mid-plane construction. By providing a two piece mid-plane, manufacturing time and costs may be reduced because the vias in the mid-plane may be plated more efficiently. Additionally, back-drilling the mid-planes may be eliminated. Furthermore, a two piece mid-plane construction may create internal or blind vias using conventional printed circuit board construction techniques rather than current high risk, experimental blind via construction techniques.

In one embodiment of the invention, a mid-plane can be, and preferably is, made of a two piece construction. In this manner, the mid-plane includes a first printed circuit board having a plurality of plated vias adapted to receive tails attached to a first connector. The first circuit board also has a plurality of unplated clearance holes adapted to receive tails attached to a second connector. The mid-plane also includes a second printed circuit board having a plurality of plated vias adapted to receive tails attached to the second connector and having a plurality of unplated clearance adapted to receive tails attached to the first connector.

BRIEF DESCRIPTION OF THE DRAWINGS

The invention is further described in the detailed description that follows, by reference to the noted drawings by way of non-limiting illustrative embodiments of the invention, in which like reference numerals represent similar parts throughout the drawings, and wherein:

FIG. 3 shows a cross sectional view of the two piece mid-plane of FIG. 2; and

FIG. 4 shows a reverse cross sectional view of the two piece mid-plane of FIG. 2.

DETAILED DESCRIPTION OF ILLUSTRATIVE EMBODIMENTS

Figure 1:
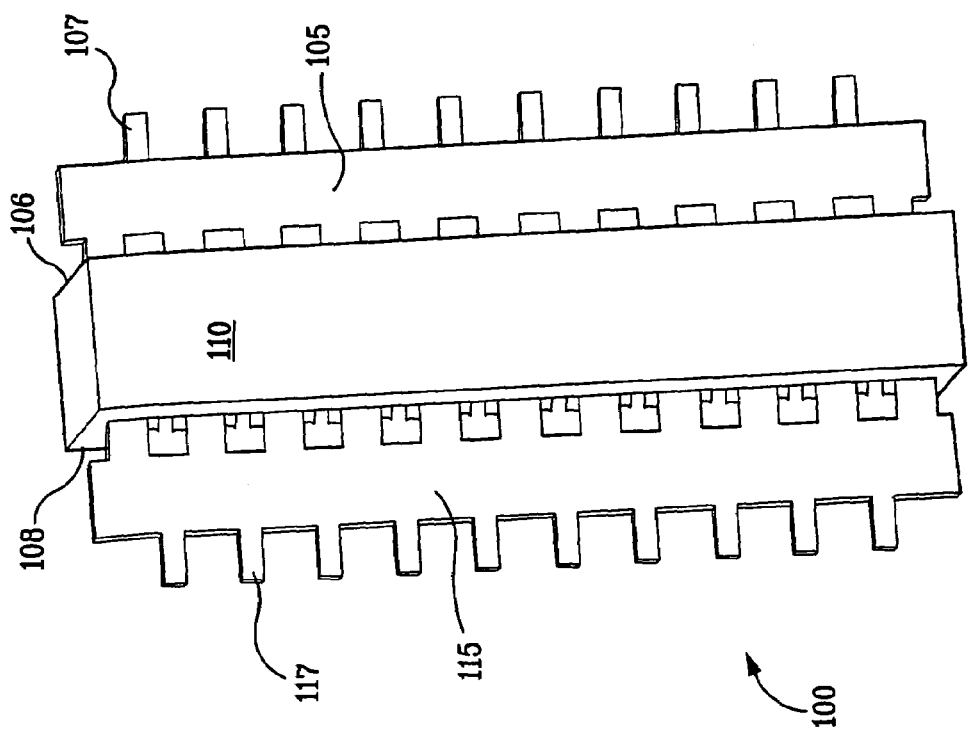
FIG. 1 shows a typical mid-plane having two connectors attached thereto.

FIG. 1 shows a typical mid-plane 100 having two connectors attached thereto. As shown, connector 105 and connector 115 are attached to the mid-plane 110. Particularly, connector 105 is attached to one surface 106 of mid-plane 110 and connector 115 is connected to another surface 108 of mid-plane 110. Conductive pins 107 on connector 105 extend into mid-plane 110 such that electrical communication is established between the connector 105 and the mid-plane 110. Also, conductive pins 117 on connector 115 extend into mid-plane 110 such that electrical communication can be established between the connector 115 and the mid-plane 110. Plated vias (not shown) are typically used to establish electrical connection between the connectors 105 and 115 and the mid-plane 110.

Figure 2:
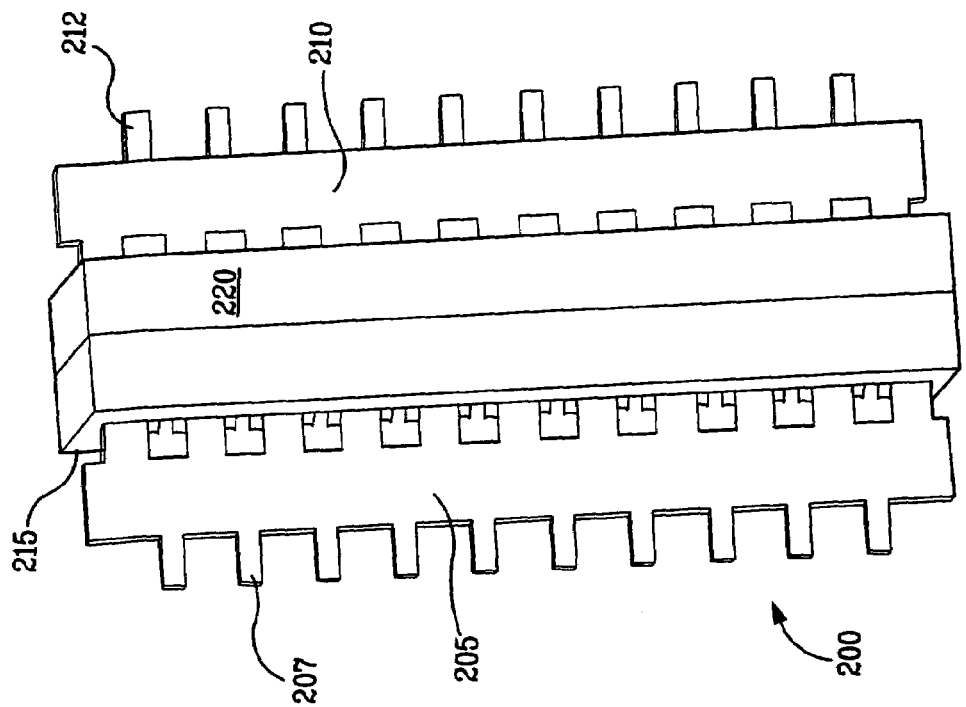
FIG. 2 shows one embodiment of a two piece mid-plane according to the invention.

FIG. 2 shows one embodiment of a two piece mid-plane according to the invention. Unlike the typical mid-plane shown in FIG. 1, the mid-plane 200 according to the invention is comprised of two pieces. As shown, the mid-plane 200 includes printed circuit board A 220 and printed circuit board B 215. Conductive pins 212 on connector 210 extend into mid-plane 200 such that electrical communication can be established between the connector 210 and the mid-plane 200. Also, conductive pins 207 on connector 205 extend into mid-plane 200 such that electrical communication can be established between the connector 205 and the mid-plane 200. As shown in FIG. 2, in one embodiment, an electrically conductive material, such as copper sheet 271, can be inserted between the two printed circuit boards to carry high and low current or act as an electrical ground. However, an electrically conductive material between the printed circuit boards may or may not be used without departing from the scope of invention.

In one embodiment of the invention, an adhesive material (not shown) may be used between the printed circuit board A 220 and printed circuit board B 215. However, no adhesive material may be used without departing from the invention.

FIG. 3 shows a cross sectional view of the two piece mid-plane of FIG. 2. As shown, like in FIG. 2, the mid-plane 200 includes printed circuit board A 220 and printed circuit board B 215. Conductive pins 207 on connector 205 extend into mid-plane 200 such that electrical communication can be established between the connector 205 and the mid-plane 200.

As can be seen in FIG. 3, conductive pins 212 on connector 210 extend into mid-plane 200 such that electrical communication can be established between the connector 210 and the mid-plane 200. Specifically, printed circuit board 215 includes vias 245 that are plated with a conductive material such that electrical communication can be established with printed circuit board A 215 of mid-plane 200. Conductive pins 212 also extend through clearance holes 270 drilled through printed circuit board B 220 of mid-plane 200. In one embodiment of the invention, clearance holes 270 in printed circuit board B 220 are not plated with a conductive material and therefore no electrical communication is established between board 220 and connector 210. However, in another embodiment of the invention, clearance holes 270 in printed circuit board B 220 are plated with a conductive material and therefore an electrical communication can be established between board 220 and connector 210.

In one embodiment of the invention, as can be seen in FIG. 3, conductive pins 212 can include terminal tails 275. Specifically, as shown, in one embodiment, terminal tails 275 of conductive pins 212 may be press fit tails. However, any kind of pin tail may be used without departing from the invention. For example, solder tails using pin-in-paste or double sided solder reflow methods may be used without departing from the invention. Also as shown in the embodiment shown in FIG. 3, an electrically conductive material, such as copper sheet 271, can be inserted between the two printed circuit boards to carry high and low current or act as an electrical ground.

FIG. 4 shows a reverse cross sectional view of the two piece mid-plane of FIG. 2. Like FIG. 2, the mid-plane 200 includes printed circuit board A 220 and printed circuit board B 215. Conductive pins 212 on connector 210 extend into mid-plane 200 such that electrical communication can be established between the connector 210 and the mid-plane 200.

As can be seen in FIG. 4, conductive pins 207 on connector 205 extend into mid-plane 200 such that electrical communication can be established between the connector 205 and the mid-plane 200. Specifically, printed circuit board 220 includes vias 222 that are plated with a conductive material such that electrical communication can be established with printed circuit board 220 of mid-plane 200. Conductive pins 207 also extend through clearance holes 290 drilled through printed circuit board 215 of mid-plane 200. In one embodiment of the invention, clearance holes 290 in printed circuit board A 215 are not plated with a conductive material and therefore no electrical communication is established between board 215 and connector 205. However, in another embodiment of the invention, clearance holes 290 in printed circuit board A 215 are plated with a conductive material and therefore an electrical communication can be established between board 215 and connector 205.

In one embodiment of the invention, as can be seen in FIG. 4, conductive pins 207 can include a terminal tails 292. Specifically, as shown, in one embodiment, terminal tail 292 of conductive pins 207 may be press fit tails. However, any kind of pin tail may be used without departing from the invention. For example, solder tails using pin-in-paste or double sided solder reflow methods may be used without departing from the invention. Also as shown in the embodiment shown in FIG. 4, an electrically conductive material, such as copper sheet 271, can be inserted between the two printed circuit boards to carry high and low current or act as an electrical ground.

As can be seen from FIG. 3 and FIG. 4, by providing a mid-plane having a two piece construction, the depth of the vias on each of the two pieces of the mid-plane are effectively reduced by half. In this manner, the vias may be more easily and effectively plated which allows for better electrical communication between any electrical device in communication with the via. Additionally, be reducing the depth of the via, back-drilling may be eliminated.

In another embodiment of the invention, conductive pins 212 and 207 may be used to secure printed circuit board A 215 and printed circuit board B 220 together. In this manner, clearance holes and vias in printed circuit board A 215 and printed circuit board B 220 may be dimensioned such that an interference fit occurs between the conductive pins 212 and 207 and the printed circuit boards 215 and 220. In this manner, the aforementioned adhesive material need not be used to secure printed circuit board A 215 and printed circuit board B 220 together.

It is to be understood that the foregoing illustrative embodiments have been provided merely for the purpose of explanation and are in no way to be construed as limiting of the invention. Words which have been used herein are words of description and illustration, rather than words of limitation. Further, although the invention has been described herein with reference to particular structure, materials and/or embodiments, the invention is not intended to be limited to the particulars disclosed herein. Rather, the invention extends to all functionally equivalent structures, methods and uses, such as are within the scope of the appended claims. Those skilled in the art, having the benefit of the teachings of this specification, may affect numerous modifications thereto and changes may be made without departing from the scope and spirit of the invention in its aspects.

What is claimed:

1. A mid-plane comprising:
   a first printed circuit board that defines a first plated via and a first unplated clearance hole; and
   a second printed circuit board positioned adjacent to the first circuit board, wherein the second printed circuit board defines a second plated via and a second unplated clearance hole;
   wherein the first plated via is aligned with the second unplated clearance hole and the second plated via is aligned with the first unplated clearance hole.

2. The mid-plane of claim 1, further comprising an adhesive material affixed between the first circuit board and the second circuit board such that the first and second circuit boards are secured to one another.

3. The mid-plane of claim 1 wherein the aspect ratio of the vias on the first circuit board is less than 12.

4. The mid-plane of claim 1 wherein the aspect ratio of the vias on the first circuit board is less than 8.

5. The mid-plane of claim 1 further comprising a first electrical connector pin, wherein the first electrical connector pin electrically connects to the first plated via and is electrically insulated with respect to the second unplated clearance hole.

6. The mid-plane of claim 5 further comprising a second electrical connector pin, wherein the second electrical connector pin electrically connects to the second plated via and is electrically insulated with respect to the first unplated clearance hole.

7. The mid-plane of claim 1 further comprising an electrically conductive sheet positioned between the first circuit board and the second circuit board.

8. The mid-plane of claim 1 wherein a first pin is inserted into and through the first unplated clearance hole, then into and connecting with the second plated via, and a second pin is inserted into and through the second unplated clearance hole, then into and connecting with the first plated via.

9. The mid-plane of claim 8 wherein the insertion and connection of the first and the second pins provide an interference fit such that the first and second printed circuit boards are secured to each other.

10. A mid-plane comprising:
a first portion having a plurality of plated vias adapted to receive tails attached to a first connector and having a plurality of unplated clearance holes adapted to receive tails attached to a second connector; and
a second portion adjacent to the first portion and having a plurality of plated vias adapted to receive tails attached to the second connector and having a plurality of unplated clearance holes adapted to receive tails attached to the first connector;
wherein the vias and the holes of the first portion, and the tails of the first connector, are configured to provide electrical connection of the first connector to the first portion with the second portion positioned therebetween; and
wherein the vias and the holes of the second portion, and the tails of the second connector, are configured to provide electrical connection of the second connector to the second portion with the first portion positioned therebetween.

11. An electrical device comprising:
a mid-plane printed circuit board comprising:
a first printed circuit board having a plurality of plated vias and a plurality of clearance holes;
a second printed circuit board adjacent to the first printed circuit board and having a plurality of plated vias and a plurality of clearance holes;
a first electrical connector having a plurality of conductive pins, each pin being adapted to extend through one of the plurality of clearance holes on the first printed circuit board and further adapted to extend into one of the plated vias on the second printed circuit board; and
a second electrical connector having a plurality of conductive pins, each pin being adapted to extend through one of the plurality of clearance holes on the second printed circuit board and further adapted to extend into one of the plated vias on the first printed circuit board.

12. The electrical device of claim 11 wherein the pins on the first and second electrical connector are press fit tails.

13. An electrical device comprising:
a mid-plane printed circuit board comprising:
a first printed circuit board having a plurality of plated vias and a plurality of clearance holes;
a second printed circuit board adjacent to the first printed circuit board and having a plurality of plated vias and a plurality of clearance holes;
a first electrical connector, adjacent to the first printed circuit board, the first electrical connector having a plurality of conductive pins adapted to extend through the plurality of clearance holes on the first printed circuit board and further adapted to extend into the plated vias on the second printed circuit board; and
a second electrical connector, adjacent to the second printed circuit board, the second electrical connector having a plurality of conductive pins adapted to extend through the plurality of clearance holes on the second printed circuit board and further adapted to extend into the plated vias on the first printed circuit board.

14. The electrical device of claim 13 wherein the conductive pins on the first and second electrical connector provide an interference fit such that the first and second printed circuit boards of the mid-plane are secured to each other.

15. The electrical device of claim 13 wherein the conductive pins on the first and second circuit board are press fit tails.

16. A mid-plane comprising:
a first printed circuit board having a plurality of plated vias adapted to receive all pins attached to a first connector, the first printed circuit board also having a plurality of unplated clearance holes adapted to receive, and provide pass-through of, all pins attached to a second connector; and
a second printed circuit board adjacent to the first circuit board and having a plurality of plated vias adapted to receive all pins attached to the second connector, the second printed circuit board also having a plurality of unplated clearance holes adapted to receive, and provide pass-through of, all pins attached to the first connector.

17. The mid-plane of claim 16 wherein the aspect ratio of the vias on the first circuit board is less than 12.

18. The mid-plane of claim 16 wherein the aspect ratio of the vias on the first circuit board is less than 8.

19. The mid-plane of claim 16 wherein reception of the pins attached to the first and second connectors provide an interference fit, thereby securing the first and the second printed circuit board to one another.

* * * * *